US009188970B2

(12) United States Patent
Blacha et al.

(10) Patent No.: US 9,188,970 B2
(45) Date of Patent: Nov. 17, 2015

(54) CIRCUIT ASSEMBLY HAVING A CONVERTER PART COMPRISING A CENTRAL CONTROL UNIT

(75) Inventors: Norbert Blacha, Warstein (DE); Andreas Peck, Moehnesee (DE); Dieter Brandt, Warstein (DE)

(73) Assignee: AEG Power Solutions B.V., Zwanenburg (NL)

( * ) Notice: Subject to any disclaimer, the term of this patent is extended or adjusted under 35 U.S.C. 154(b) by 866 days.

(21) Appl. No.: 13/395,979

(22) PCT Filed: Sep. 16, 2010

(86) PCT No.: PCT/EP2010/063627
§ 371 (c)(1),
(2), (4) Date: May 29, 2012

(87) PCT Pub. No.: WO2011/033027
PCT Pub. Date: Mar. 24, 2011

(65) Prior Publication Data
US 2012/0230072 A1    Sep. 13, 2012

(30) Foreign Application Priority Data
Sep. 17, 2009   (DE) .......................... 10 2009 041 632

(51) Int. Cl.
*H02M 7/42*      (2006.01)
*G05B 19/042*    (2006.01)
*H01L 31/02*     (2006.01)

(52) U.S. Cl.
CPC ...... *G05B 19/0421* (2013.01); *H01L 31/02021* (2013.01); *G05B 2219/25232* (2013.01); *Y02E 10/50* (2013.01)

(58) Field of Classification Search
CPC ................. G05B 19/0421; G05B 2219/25232; H01L 31/02021; Y02E 10/50
See application file for complete search history.

(56) References Cited

U.S. PATENT DOCUMENTS

| 7,363,516 | B2 * | 4/2008 | Bresniker et al. | ............. 713/300 |
| 7,560,831 | B2 * | 7/2009 | Whitted et al. | ................. 307/64 |
| 7,886,173 | B2 * | 2/2011 | Krieger et al. | ................ 713/330 |
| 8,080,900 | B2 * | 12/2011 | Corhodzic et al. | ............. 307/66 |

(Continued)

FOREIGN PATENT DOCUMENTS

| DE | 202005007220 U1 | 9/2006 |
| DE | 102007049313 A1 | 4/2009 |

(Continued)

*Primary Examiner* — Charles Kasenge
(74) *Attorney, Agent, or Firm* — Cohen & Hildebrand, PLLC

(57) ABSTRACT

Circuit assembly (1, 1a), uninterrupted power supply unit (1a) with converter part (2) and converter unit (20), central control unit (21) and input for current to be converted and output for converted current and circuit part (3, 4) connected upstream of input of converter part or connected downstream of output of converter part, external control unit (12) connectable to circuit assembly and central control unit (21) configured to receive control instructions from external control unit (12). Circuit assembly can be disconnected from the power supply network rapidly and without repercussions on the network. Every circuit part (3, 4) comprises a decentralized control unit (31, 41), connected to central control unit (21) via communication bus (13), receiving control instructions from central control unit (21). External control unit (12) is connected to communication bus (13) and decentralized control unit (31, 41) is configured to receive control instructions from external control unit (12).

19 Claims, 3 Drawing Sheets

(56) References Cited

U.S. PATENT DOCUMENTS

| | | | |
|---|---|---|---|
| 8,624,433 B2* | 1/2014 | Whitted et al. | 307/66 |
| 2005/0094343 A1 | 5/2005 | Mintz, Jr. | |
| 2007/0278860 A1* | 12/2007 | Krieger et al. | 307/64 |
| 2008/0030078 A1* | 2/2008 | Whitted et al. | 307/66 |
| 2009/0021078 A1* | 1/2009 | Corhodzic et al. | 307/67 |
| 2009/0206670 A1* | 8/2009 | Whitted et al. | 307/64 |
| 2010/0141046 A1* | 6/2010 | Paik | 307/126 |
| 2010/0145884 A1* | 6/2010 | Paik | 705/412 |

FOREIGN PATENT DOCUMENTS

| | | |
|---|---|---|
| DE | 102007050031 B1 | 4/2009 |
| DE | 102007047890 A1 | 6/2009 |
| EP | 1031420 A1 | 8/2000 |

* cited by examiner

CIRCUIT ASSEMBLY HAVING A CONVERTER PART COMPRISING A CENTRAL CONTROL UNIT

This is an application filed under 35 USC §371 of PCT/EP2010/063627, claiming priority to DE 10 2009 041 632.3 filed on Sep. 17, 2009.

BACKGROUND OF THE INVENTION

The present invention relates to a circuit arrangement, in particular inverters or uninterruptable power supplies, with a converter section including a converter unit, a central control unit and an input for the current to be converted and an output for the converted current and at least one circuit part which is connected before the input of the converter section or is connected after the output the converter section, wherein at least one external control unit can be connected to the circuit arrangement and that the central control unit is suitable and configured to receive control instructions of the external control unit.

From the translation of the European patent having the publication number DE 600 36 150 T2, a network of solar inverters is known which have an inverter section with an inverter unit and a microcomputer as the central control unit. The network has as external control units remote controls, which are connected to the microcomputer and are able to control the microcomputer. The remote control can also specifically operate a switch in a circuit part arranged on the input-side of a solar inverter.

The translation of the European patent having the publication number DE 600 36 150 T2 describes, how the solar inverters which are connected in parallel to the power grid, can be operated.

The operators of the transmission network or distribution network, into whose power grids electrical energy is fed, issue detailed instructions relating to the configuration of the grid connection for feeding electric energy from photovoltaic systems. Special regulations relating to safety are issued in particular for photovoltaic systems having a power rating of greater than 30 kW. For example, it must be ensured that the photovoltaic system can be disconnected from the power grid quickly and with the least effect on the power grid even in the event of only a partial failure, for example of the solar inverter. A similar problem may occur with uninterrupted power supplies.

BRIEF SUMMARY OF THE INVENTION

This problem is solved according to the invention in that each circuit part has at least one decentralized control unit, which is connected to the central component unit via a communication bus and which is suitable and configured to receive control instructions from the central control unit, and in that the external control unit can be connected to the communication bus and the decentralized control unit is suitable and configured to receive control instructions of the external control unit.

Unlike with the circuit arrangement known from the document DE 600 36 150 T2, with the circuit arrangement according to the invention an external control unit can operate directly via the communication bus on decentralized units in the circuit part(s), so as to for example completely disconnect the circuit arrangement both on the input side and on the output side. The external control unit can then intervene even if the central control unit in the inverter section fails. By using a communication bus for information exchange, the circuit arrangement can be easily expanded with additional converter sections, circuit parts and/or other decentralized control units in the circuit parts. The circuit arrangement can thus be easily scaled.

By using decentralized control units, the central control unit can be relieved of subordinate control tasks, which can then be executed by the decentralized control units.

A circuit arrangement according to the invention may include a communication unit. This communication unit may be arranged between the communication bus and a connection of the circuit arrangement for the external control unit. The connection of the circuit arrangement for the external control unit may include an interface to a public communication network. The external control unit can thus output control instructions to the circuit arrangement via the public communication network. The communication unit may include an interface to the communication bus and a driver circuit for this interface.

The circuit part(s) of a circuit arrangement according to the invention may include fuses, switches, in particular controllable switches, for example circuit breakers, measurement value transducers, isolation monitors and the like. Measurement values about the decentralized control units can be supplied by the measurement value transducers to the central control unit and/or also to the external control unit. The central control unit and/or the external control unit may then generate in response to the acquired measurement values control instructions for the decentralized control units and/or the central control unit. The measurement information obtained in the circuit parts can preferably be provided in the communication bus via the decentralized control unit.

The circuit arrangement according to the invention may include several cabinets. The inverter section may be arranged in a cabinet. The circuit part(s) may also be arranged in dedicated cabinets. Advantageously, a dedicated cabinet is assigned to the converter section and to each circuit part. Each cabinet then includes a section of the communication bus. The sections of the communication bus may be connected to each other via interfaces. Moreover, each advantageous cabinet has a power connection for the auxiliary current supply and/or the current supply of the central and/or decentralized control units.

Preferably, each of the central control unit and the decentralized control units has its own electrical power supply. In this way, the control units can be supplied with electric energy independent from each other. Separate energy may be supplied via the central control unit in addition to the energy supplied to the decentralized control unit.

The circuit arrangement may be an inverter, in particular a solar inverter. Such inverter has an input-side circuit part and an output-side circuit part. The input-side circuit part may then be connected to a generator, e.g. a solar generator, during the operation of the inverter, and the output-side circuit part may be connected to a transmission network or distribution network, also referred to as power grids.

The circuit arrangement may also be an uninterrupted power supply. The circuit arrangement has then an output-side circuit part, wherein the converter section is connected to a generator, a storage element for electric energy or a power grid supplying energy. The output-side circuit part may be connected to a network to be powered, for example a building installation.

Such uninterrupted power supply may include a central electronic switching device with a control unit or a static transfer switch with a control unit. These control units may form the external control units which can be connected to the uninterrupted power supply.

A network may be formed from one or several circuit arrangements according to the invention and an external control unit, wherein the external control unit is suitable and configured for parallel control of the central and/or decentralized control units. The external control unit may be a master computer of the network.

This type of network according to the invention has the advantage that it can be operated so that the external control unit controls, and more particularly shuts down, one of the circuit arrangements of the decentralized control units of this circuit arrangement, when the central control unit fails.

Additional features and advantages of the present invention will become clear based on the following description of preferred exemplary embodiments with reference to the appended drawings. These show in form of schematic diagrams in:

DETAILED DESCRIPTION OF THE INVENTION

Figure 1:
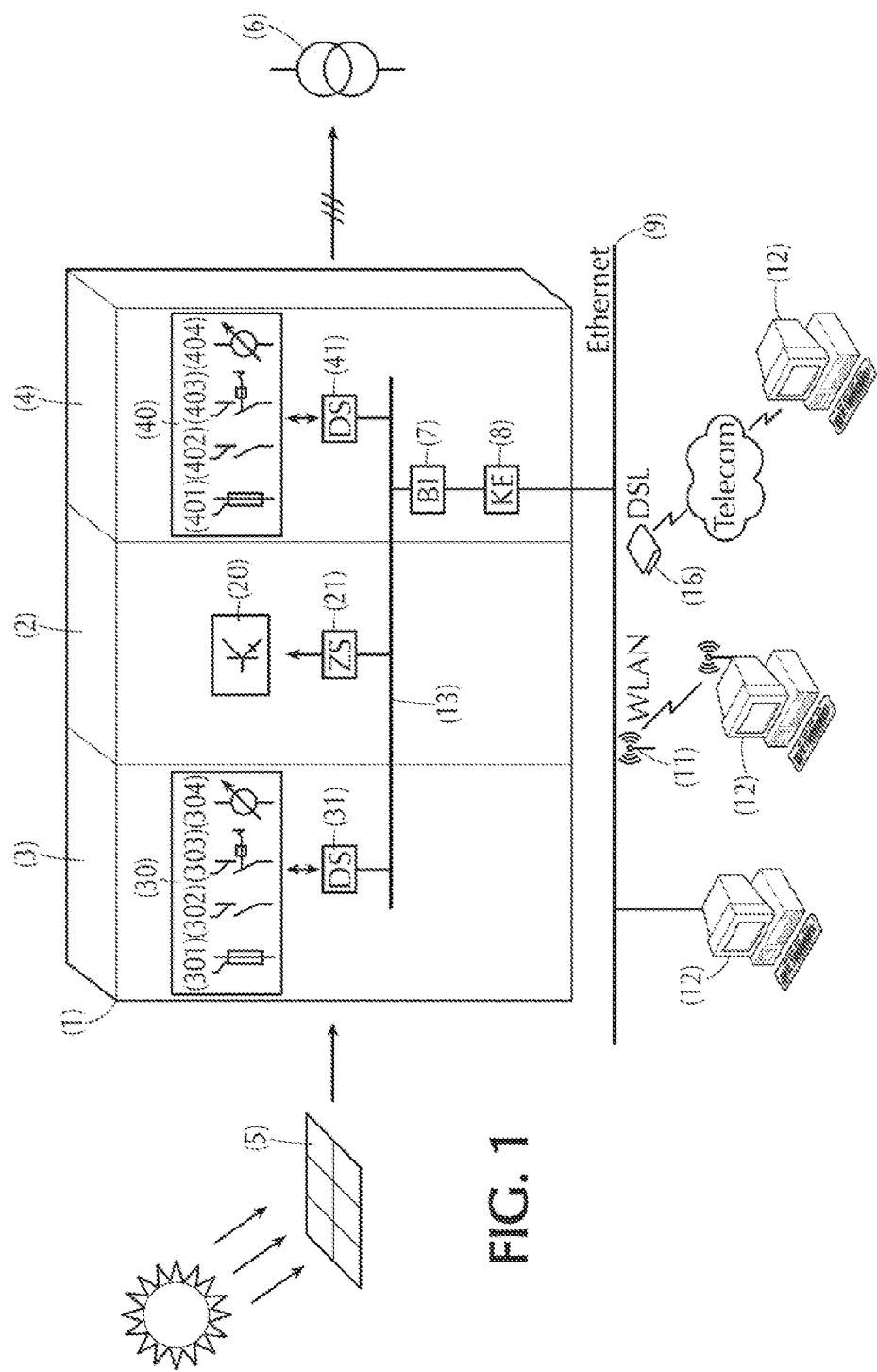
FIG. 1 a network of a solar inverter according to the invention with a connection to several external control units, FIG. 2 a network of several solar inverters according to the invention and several external control units, and FIG. 3 a network of an uninterrupted power supply according to the invention and several external control units.

The solar inverter 1 according to the invention illustrated in FIG. 1 includes a converter section 2, an input-side circuit part 3 and an output-side circuit part 4. The input-side circuit part 3 is connected to a solar generator 5, which converts solar radiation energy into electric energy. The solar generator 5 supplies a DC current which is converted in the solar inverter 1 into an AC current. The conversion of the DC current into AC current takes place in the converter section 2. The AC current is then fed into a power grid 6 via the output-side circuit part 4. The feed may be three-phase.

Various components 30 may be provided in the input-side circuit part. These components may be, for example, fuses 301, switches 302, circuit breakers 303, measurement value transducers, isolation monitors 304 and the like. These components can be used to, for example, interrupt or measure the current. The solar inverter 1 may also be protected by fuses 301.

A converter unit 20 is provided in the converter section 2, where the DC current supplied from the solar generator 5 into the solar inverter 1 via the input-side circuit part 3 is converted into an AC current.

The AC current is then supplied to the power grid 6 via the output-side circuit part 4. Various components 40 are provided in the output-side circuit part 4. These components 40 can be used to, for example, switch, measure or monitor the current. In addition, the solar inverter 1 can be protected from feedback from the power grid 6. The components 40 can thus be fuses 401, switches 402, circuit breakers 403, isolation monitors and measurement value transducers 404.

The processes in the solar inverter 1 are typically controlled, monitored and/or regulated by a central control unit 21. The central control unit 21 is arranged in the converter section 2. In addition to the central control unit 21, decentralized control units 31, 41 are provided in the input-side circuit part 3 and the output-side circuit part 4. These decentralized control units 31, 41 are connected to the components 30, 40 in the input-side circuit part 3 and the output-side circuit part 4, in order to control/regulate these components 3, 4 and/or to evaluate the measurement values supplied by the components and/or transmit the measurement values to the central control unit 21.

The connection between the central control unit 21 and the decentralized control units 31, 41 is established via a communication bus 13. All information, such as measurement values or control instructions, is exchanged via the communication bus. The central control unit 21 is hereby the master entity, with the decentralized control unit 31, 41 being slaves.

Furthermore, this solar inverter 1 has a bus interface 7 which is likewise connected to a communication bus 13. The bus interface 7 is connected to a communication unit 8 which in turn has an interface to an external network 9.

Various external control units 12 are connected to the external network 9, either directly via the corresponding interface of the external control unit 12 to the network or by interconnecting a WLAN network 11 or via a public telecommunication network via a DSL modem 16.

Access to the central control unit 21 as well as to the decentralized control unit 31, 41 is enabled via the external control units 11. In this way, processes in the input-side circuit part 3, the converter section 2 and the output-side circuit part 4 can be controlled, regulated or monitored and/or measured by the external control units 12. This has the advantage that, even when one of the control units inside the solar inverter 1 fails, the remaining control units can be addressed to shut down the solar inverter 1.

Figure 2:
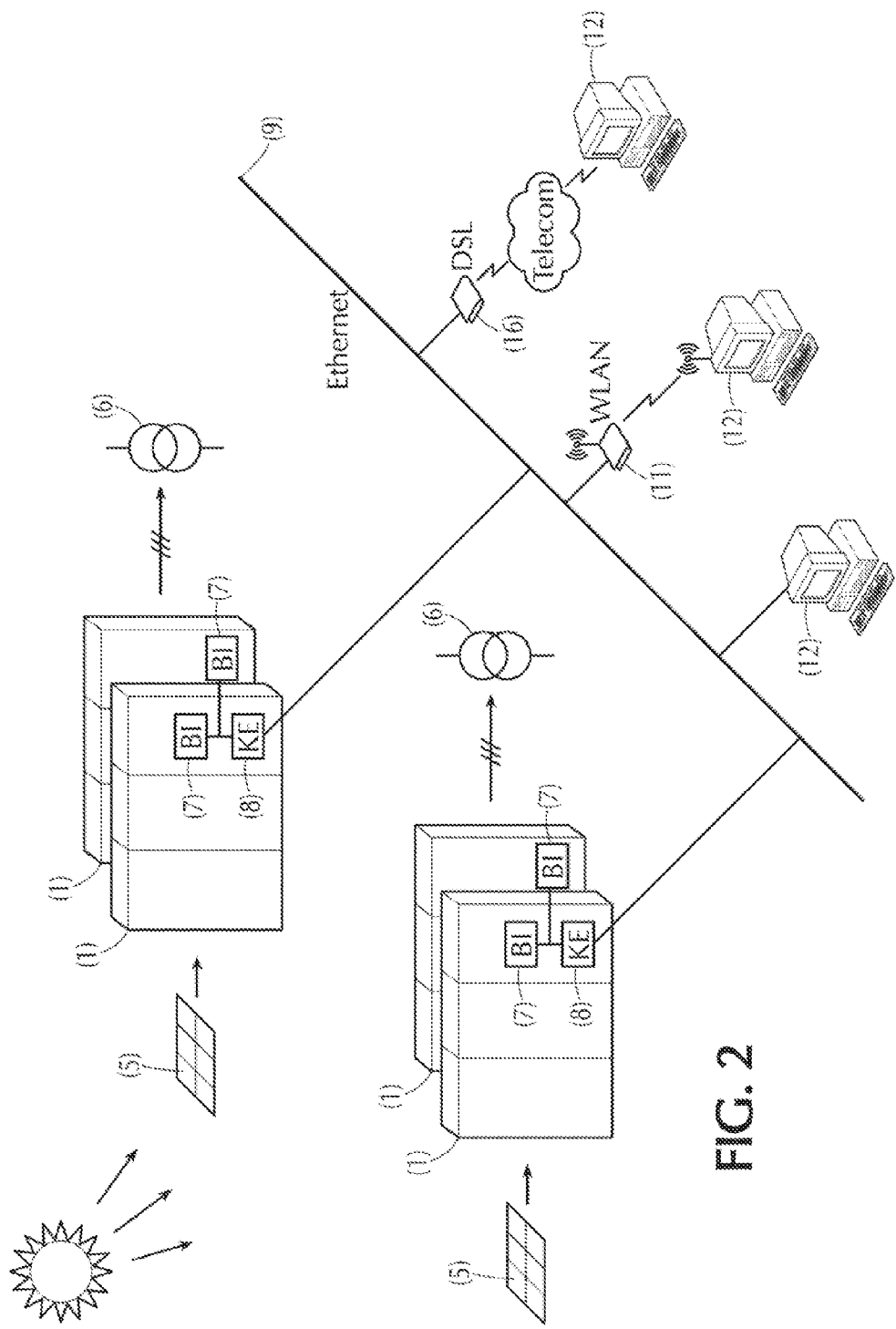

Such solar inverter 1 can be coupled with another solar inverter 1 to form a pair. The two coupled solar inverters 1 (see FIG. 2) are then connected with each other via their bus interfaces or directly via the communication bus 13.

A single solar inverter 1, but also the pair of solar inverters 1, can be connected via the communication unit with a network 9, to which other solar inverters 1 or pairs of solar inverters 1 are connected. The solar inverters 1 can then be controlled, regulated, measured or monitored via external control units 12 that are likewise connected to the network 9. Control interventions can be performed by an external control unit 12 simultaneously on all solar inverters 1. It would also be feasible to control, regulate, monitor, etc., a single solar inverter 1 or a group of solar inverters 1 connected to the network 9.

Figure 3:
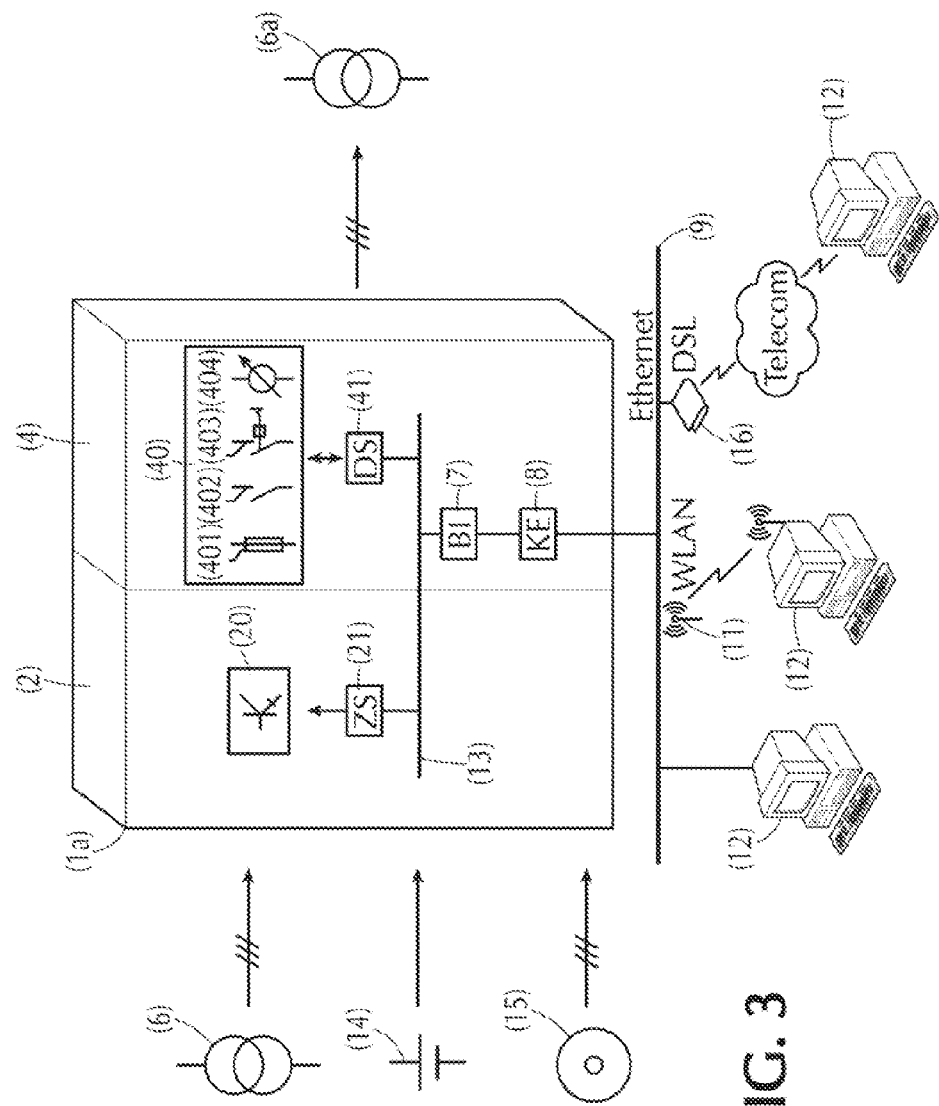

The uninterrupted power supply 1a illustrated in FIG. 3 can, like the aforedescribed solar inverter 1, be controlled or regulated or monitored by an external control unit 12. The uninterrupted power supply 1a also includes a converter section 2 and an output-side circuit part 4. The converter section 2 is supplied with electric energy directly from a power grid 6, a battery 14 or a generator 15. The electric energy is converted in the converter section as needed so that it can be fed via the output-side circuit part 4 into a network 6a to be powered.

The converter section 2 has also a converter unit 20 which is monitored, regulated and/or controlled by a central control unit 21. The central control unit 21 also monitors, regulates and/or controls a decentralized control unit 41 of the output-side circuit part 4. The decentralized control unit 41 in turn monitors, controls and/or regulates components 40 in the output-side circuit part 4. The central control unit 21 then has also access to the components 40 via the interconnected decentralized control unit 41.

The components 40 may be fuses 401, switches 402, circuit breakers 403, measurement value transducers 404 and the like, which can be used to control, regulate, switch and/or monitor current and/or voltage.

The central control unit 21 is connected to the decentralized control unit 41 via a communication bus 13. A communication unit 8 is connected to the communication bus 13 via a bus interface 7. The communication unit 8 is further connected to an external network 9 configured to establish a connection to one of the external control units 12. The connection to the external control units may be established directly via the network 9 when the external control unit 12 is directly connected to the network 9. However, for example, a WLAN network 11 or a public telecommunication network may be interconnected. In this case, a DSL modem 16 is connected.

The external control units 12 can directly access the decentralized control unit 41 as well as the central control unit 21 and control, regulate and/or monitor the components 40 connected to these control units 21, 41 and/or the converter unit 20.

The invention claimed is:

1. A circuit assembly (1, 1*a*) comprising:
 a converter section (2) comprising:
  a converter unit (20),
  a central control unit (21),
  an input of the converter section (2) for current to be converted and
  an output of the converter section (2) for the converted current,
 at least one circuit part (3, 4) connected upstream of the input of the converter section or downstream of the output of the converter section,
 at least one external control unit (12) is connected to the circuit assembly, and the central control unit (21) is suitable and configured to receive control instructions from the external control unit (12), and
 wherein each circuit part (3, 4) comprises at least one decentralized control unit (31, 41) connected to the central control unit (21) via a communication bus (13), the at least one decentralized control unit (31, 41) is suitable and configured to receive control instructions from the central control unit (21),
 and wherein the external control unit (12) is connectable to the central control unit (21) via the communication bus (13); and the decentralized control unit (31, 41) is suitable and configured to receive control instructions from the external control unit (12),
 wherein the circuit assembly (1, 1*a*) comprises several cabinets, and the converter section (2) is arranged in one cabinet and the circuit part(s) (3, 4) is/are arranged in respective dedicated cabinets,
 wherein the circuit assembly (1, 1*a*) includes a first decentralized control unit (31) and a second decentralized control unit (41); and wherein the central control unit (21), the first decentralized control unit (31) and the second decentralized control unit (41) each comprise dedicated electrical power supplies,
 wherein the first decentralized control unit (31) and the second decentralized control unit (41) are additionally supplied with electric energy from the power supply of the central control unit (21).

2. The circuit assembly (1, 1*a*) according to claim 1, wherein the circuit assembly (1, 1*a*) further comprises a communication unit (7, 8) arranged between the communication bus (13) and a connection of the circuit assembly for the external control unit (12).

3. The circuit assembly (1, 1*a*) according to claim 2, wherein the connection of the circuit assembly (1, 1*a*) to the external control unit (12) comprises an interface to a public communication network or a local network (9).

4. The circuit assembly (1, 1*a*) according to claim 2, wherein the communication unit (7, 8) comprises an interface to the communication bus (13) and a driver circuit (8) for this interface.

5. The circuit assembly (1, 1*a*) according to claim 1, wherein the at least one circuit part (3, 4) comprises a fuse (301, 401) and a switch (302, 402).

6. The circuit assembly (1, 1*a*) according to claim 1, wherein the at least one circuit part (3, 4) comprises at least one of: a fuse (301, 401), a switch (302, 402), circuit breakers (303, 403), measurement value transducers (304, 404), and isolation monitors.

7. The circuit assembly (1, 1*a*) according to claim 6, wherein the switch (302, 402) is controllable.

8. The circuit assembly (1, 1*a*) according to claim 1, wherein the decentralized control unit (31, 41) is configured to provide on the communication bus (13) measurement information obtained in the circuit part (3, 4).

9. The circuit assembly (1, 1*a*) according to claim 1, wherein the circuit assembly (1, 1*a*) is an inverter (1) and comprises an input-side circuit part (3) and an output-side circuit part (4), wherein the input-side circuit part (3) is connected to a generator.

10. The circuit assembly (1, 1*a*) according to claim 9, wherein the generator is a solar generator (5).

11. The circuit assembly (1, 1*a*) according to claim 9, wherein the output-side circuit part is connected to a power grid (6).

12. The circuit assembly (1, 1*a*) according to claim 1, wherein the circuit assembly (1, 1*a*) is an uninterrupted power supply (1) and comprises an output-side circuit part (4), wherein the converter section (2) is connected to one of a generator (15), a storage device for electrical energy (14) or a power grid (6) supplying energy, and the output-side circuit part is connected to a network (6*a*) to be powered.

13. The circuit assembly (1, 1*a*) according to claim 12, wherein the circuit assembly (1, 1*a*) comprises a central electronic switching device with a control unit or a static transfer switch with a control unit, and wherein the control unit forms the external control unit (12).

14. The circuit assembly (1, 1*a*) according to claim 1, wherein the circuit assembly is an inverter (1).

15. The circuit assembly (1, 1*a*) according to claim 1, wherein the circuit assembly is an uninterrupted power supply (1*a*).

16. A network including at least one circuit assembly (1, 1*a*) comprising:
 a converter section (2) comprising:
  a converter unit (20),
  a central control unit (21),
  an input of the converter section (2) for current to be converted and
  an output of the converter section (2) for the converted current,
 at least one circuit part (3, 4) connected upstream of the input of the converter section or downstream of the output of the converter section,
 at least one external control unit (12) is connected to the circuit assembly, and the central control unit (21) is suitable and configured to receive control instructions from the external control unit (12), and
 wherein each circuit part (3, 4) comprises at least one decentralized control unit (31, 41) connected to the central control unit (21) via a communication bus (13), the at least one decentralized control unit (31, 41) is suitable and configured to receive control instructions from the central control unit (21), and wherein the external control unit (12) is connectable to the central control unit (21) via the communication bus (13); and the decentralized control unit (31, 41) is suitable and configured to receive control instructions from the external control unit (12), and wherein the external control unit (12) is configured for parallel control of the central and/or decentralized control units (31, 41), wherein the circuit assembly (1, 1a) comprises several cabinets, and the converter section (2) is arranged in one cabinet and the circuit part(s) (3, 4) is/are arranged in respective dedicated cabinets, wherein the circuit assembly (1, 1a) includes a first decentralized control unit (31) and a second decentralized control unit (41); and wherein the central control unit (21), the first decentralized control unit (31) and the second decentralized control unit (41) each comprise dedicated electrical power supplies, wherein the first decentralized control unit (31) and the second decentralized control unit (41) are additionally supplied with electric energy from the power supply of the central control unit (21).

17. The network according to claim 16, wherein the external control unit (12) is a master computer.

18. A method for operating a network, comprising the steps of
providing at least one circuit assembly (1, 1a) with a converter section (2) and a converter unit (20), a central control unit (21), an input for current to be converted and an output for the converted current, at least one circuit part (3, 4), which is connected upstream of the input of the converter section or downstream of the output of the converter section, connecting at least one external control unit (12) to the circuit assembly, providing the central control unit (21) is suitable and configured to receive control instructions from the external control unit (12), wherein each circuit part (3, 4) comprises at least one decentralized control unit (31, 41) which is connected to the central control unit (21) via a communication bus (13) and suitable and configured to receive control instructions from the central control unit (21), connecting the external control unit (12) to the central control unit (21) via the communication bus (13) and the decentralized control unit (31, 41) is suitable and configured to receive control instructions from the external control unit (12), wherein the external control unit (12) is configured for parallel control of the central and/or decentralized control units (31, 41), controlling, when one of the central control units of the circuit assembly (1, 1a) fails, the external control unit (12) monitors, regulates and/or controls, wherein the circuit assembly (1, 1a) comprises several cabinets, and the converter section (2) is arranged in one cabinet and the circuit part(s) (3, 4) is/are arranged in respective dedicated cabinets, wherein the circuit assembly (1, 1a) includes a first decentralized control unit (31) and a second decentralized control unit (41); and wherein the central control unit (21), the first decentralized control unit (31) and the second decentralized control unit (41) each comprise dedicated electrical power supplies, wherein the first decentralized control unit (31) and the second decentralized control unit (41) are additionally supplied with electric energy from the power supply of the central control unit (21).

19. The method for operating a network according to claim 18, wherein the controlling step accomplishes a shut down of the decentralized control units (31, 41).

* * * * *